US008228320B2

(12) United States Patent
Morita

(10) Patent No.: US 8,228,320 B2
(45) Date of Patent: Jul. 24, 2012

(54) INTEGRATED CIRCUIT DEVICE, ELECTRO-OPTICAL DEVICE, AND ELECTRONIC APPARATUS

(75) Inventor: Akira Morita, Suwa-gun (JP)

(73) Assignee: Seiko Epson Corporation, Tokyo (JP)

( * ) Notice: Subject to any disclaimer, the term of this patent is extended or adjusted under 35 U.S.C. 154(b) by 731 days.

(21) Appl. No.: 12/402,856

(22) Filed: Mar. 12, 2009

(65) Prior Publication Data

US 2009/0244036 A1 Oct. 1, 2009

(30) Foreign Application Priority Data

Mar. 26, 2008 (JP) ................................ 2008-080904

(51) Int. Cl.
*G06F 3/038* (2006.01)
*G09G 3/20* (2006.01)
*H03K 19/0175* (2006.01)

(52) U.S. Cl. ............ 345/204; 345/55; 326/62; 327/100

(58) Field of Classification Search ........................ None
See application file for complete search history.

(56) References Cited

U.S. PATENT DOCUMENTS 7,741,871 B2 * 6/2010 Morita ........................... 326/82

FOREIGN PATENT DOCUMENTS

| | | |
|---|---|---|
| JP | A-10-79653 | 3/1998 |
| JP | A-11-95713 | 4/1999 |
| JP | A-2001-7458 | 1/2001 |
| JP | A-2001-211211 | 8/2001 |
| JP | A-2008-225494 | 9/2008 |

* cited by examiner

*Primary Examiner* — Andrew L Sniezek
(74) *Attorney, Agent, or Firm* — Oliff & Berridge, PLC

(57) ABSTRACT

An integrated circuit device includes: a high-speed serial interface circuit including a receiver circuit that receives a differential signal through a serial bus; a first terminal into which a first signal included in the differential signal is inputted; a second terminal into which a second signal included in the differential signal is inputted; a receiver circuit power supply terminal to which a power supply voltage applied to a high-voltage side of the receiver circuit is supplied; a first terminating resistor provided between the first terminal and a first node; a second terminating resistor provided between the second terminal and a second node; and a switching element provided between the first and the second nodes. In the device, the switching element is turned on in a high-speed serial interface mode and is turned off in a parallel interface mode by using the power supply from the receiver circuit power supply terminal.

14 Claims, 13 Drawing Sheets

INTEGRATED CIRCUIT DEVICE, ELECTRO-OPTICAL DEVICE, AND ELECTRONIC APPARATUS

The entire disclosure of Japanese Patent Application No. 2008-80904, filed Mar. 26, 2008 is expressly incorporated by reference herein.

BACKGROUND

1. Technical Field

An aspect of the present invention relates to an integrated circuit device, an electro-optical device, and an electronic apparatus.

2. Related Art

In recent years, high-speed serial interfaces such as a low voltage differential signaling (LVDS) have drawn attention as a communication method between LSIs. In the high-speed serial transfer, a transmitter circuit transfers serial data by a differential signal and a receiver circuit performs differential amplification to realize a data transfer.

A general projector has a substrate part that performs image processing for an image to be displayed and an optical system part which includes a liquid crystal panel (an electro-optical panel), a light source, a lens, and the like. Then, a host processor transmits image data from the substrate part, and a display driver (a driver) in the optical system part receives the image data for driving the liquid crystal panel. By a use of a high-speed serial interface in the data transfer, high-speed communication which is capable of providing a high-resolution image display is achieved.

In a conventional display driver, a micro processor unit (MPU) interface, which is a parallel interface for the MPU, is widely used as an interface between the host processor. Therefore, there is a case that both the high-speed serial interface and the parallel interface are provided in the display driver. In this case, if terminals of an interface circuit are shared, cost reduction can be achieved. However, a different terminal function in a different interface prevents the terminals from being shared.

According to some aspects of the invention, an integrated circuit device, an electro-optical device, and an electronic apparatus which are capable of sharing terminals can be provided.

SUMMARY

According to a first aspect of the invention, an integrated circuit device includes: a high-speed serial interface circuit including a receiver circuit that receives a differential signal through a serial bus; a first terminal into which a first signal included in the differential signal is inputted; a second terminal into which a second signal included in the differential signal is inputted; a receiver circuit power supply terminal to which a power supply voltage applied to a high-voltage side of the receiver circuit is supplied; a first terminating resistor provided between the first terminal and a first node; a second terminating resistor provided between the second terminal and a second node; and a switching element provided between the first and the second nodes. In the device, the switching element is turned on in a high-speed serial interface mode and is turned off in a parallel interface mode by using the power supply from the receiver circuit power supply terminal.

According to the invention, the switching element is provided in series to the terminating resistor that terminates the differential signal, and the switching element can be turned off in the parallel interface mode. Thus, the terminating resistor can be prevented from causing a load of a parallel interface mode signal. This allows sharing the terminals in the high-speed serial interface and the parallel interface. In addition, since the switching element is turned on/off by using the power supply voltage of the receiver circuit, the interface can be switched without an additional signal or terminal.

In the invention, the switching element may include a second conductivity type transistor formed on a first conductivity well, and a potential of the first conductivity well may be set in a floating state.

This allows realizing the switching element provided to the terminating resistor. Then, in the parallel interface mode, the parallel interface mode signal can be inputted into the terminal to which the terminating resistor is provided.

In the invention, the switching element may include a second conductivity type transistor formed on a first conductivity well, and a potential of the first conductivity well may be fixed to a power supply voltage applied to a high-voltage side of a logic circuit.

Similarly, the switching element provided to the terminating resistor can be realized. Then, in the parallel interface more, the parallel interface mode signal can be inputted into a terminal to which the terminating resistor is provided.

In the invention, the integrated circuit device may further include an inverter into which a voltage from the power supply terminal of the receiver circuit is inputted and operates with a power supply voltage applied to a high-voltage side of a logic circuit. In the device, the second conductivity type transistor may be turned on in the high-speed serial interface mode and turned off in the parallel interface mode based on an output of the inverter.

This enables an on/off of the switching element by the power supply voltage of the receiver circuit to be realized.

In the invention, the second conductivity type transistor of the inverter may be formed on the first conductivity type well.

Then, based on a power supply voltage of the receiver circuit, an on/off of the second conductivity type transistor included in a switching element can be realized.

In the invention, the first conductivity type well may be an N-type well, and the second conductivity type transistor of the switching element may be a P-type transistor.

Accordingly, the switching element can be composed of a CMOS transistor. Then, the N-type well is fixed to the floating state or the power supply voltage of the logic circuit so that a parallel interface signal can be inputted into a first and a second terminals.

In the invention, the integrated circuit device may further include: a first and a second guard terminals for preventing radiation in the serial bus; a first I/O buffer that inputs and outputs a parallel interface signal through the first guard terminal; and a second I/O buffer that inputs and outputs a parallel interface signal through the second guard terminal. In the device, each output of the first and the second I/O buffers in the high-speed serial interface mode may be set to a low-voltage-side level or a high impedance state based on a voltage from the receiver circuit power supply terminal.

According to the invention, the output of the I/O buffer can be switched in the high-speed interface and the parallel interface. As a result, sharing the terminals can be realized. Further, the interface is switched by using the voltage supplied to a power supply terminal VDDA in the invention. This enables selection of the interface to be realized without an additional terminal or signal.

In the invention, each of the first and the second I/O buffers may include an input buffer, an output buffer, and a logic circuit. In the device, the logic circuit may be provided at a previous stage of the output buffer and output a fixed level signal based on a voltage from the receiver circuit power supply terminal in the high-speed serial interface mode, and the output buffer may output the low-voltage-side level if the fixed level signal of the logic circuit is inputted.

Accordingly, the I/O buffer which is capable of switching the interface can be realized.

In the invention, each of the first and the second I/O buffers may include an input buffer, an output buffer, and a logic circuit. In the device, the logic circuit may output a fixed level signal based on a voltage from the receiver circuit power supply terminal in the high-speed serial interface mode, and an output of the output buffer may be set to the high-impedance state based on the fixed level signal of the logic circuit.

This also allows realizing the I/O buffer which is capable of switching the interface.

In the invention, the integrated circuit device may further include a first input buffer into which a parallel interface signal is inputted through the first terminal and a second input buffer into which a parallel interface signal is inputted through the first terminal. In the device, each of the first and the second input buffers may output a fixed level signal based on a voltage from the receiver circuit power supply terminal.

According to the invention, in the high-speed interface mode, a signal is not inputted to a logic circuit which is a subsequent stage of a parallel interface circuit and not used in the mode. This allows reducing power consumption. In addition, by a use of the power supply of the receiver circuit allows controlling the input buffer without an additional control terminal.

In the invention, the integrated circuit device may further include an inverter that operates with a logic circuit power supply voltage which is different from the power supply voltage applied to the high-voltage side of the receiver circuit. In the device, the power supply voltage applied to the high-voltage side of the receiver circuit that is supplied to the power supply terminal of the receiver circuit may be inputted into the inverter, and an output of the inverter may control the first and the second input buffers.

This allows controlling the input buffer by using the power supply voltage of the receiver circuit.

In the invention, a power supply voltage applied to a low-voltage side may be supplied to the power supply terminal of the receiver circuit in the parallel interface mode.

Therefore, switching the interface by using the power supply voltage of the receiver circuit can be realized.

According to a second aspect of the invention, an electro-optical device includes the integrated circuit device described as above.

According to a third aspect of the invention, an electronic apparatus includes the electro-optical device described as above.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention will be described in detail below. The embodiments explained below do not unduly limit the contents of the present invention described in the claims and all of the configurations explained in the embodiments are not indispensable to the means to solve the problem of the invention.

1. Electro-Optical Device

Figure 1:
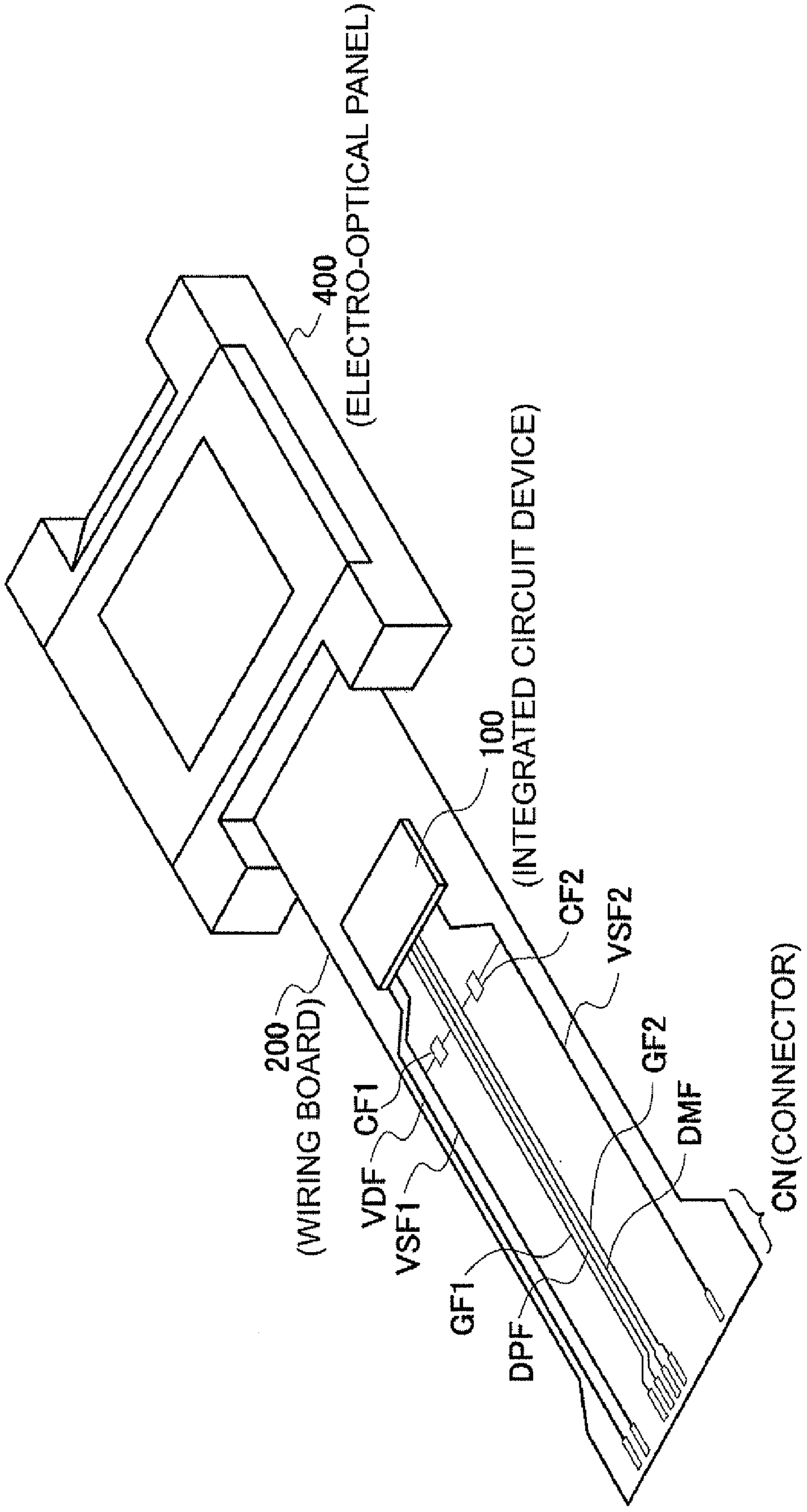
FIG. 1 is a structural example of an electro-optical device of the embodiment.

A structural example of an electro-optical device of the embodiment is shown in FIG. 1. To the structural example shown in FIG. 1, an integrated circuit device of the embodiment can be applied. For example, this structural example is used for a display of a projector, and is coupled to an electronic substrate of the projector at a connector CN. It is understood that the integrated circuit of the embodiment can be applied to another electronic apparatus such as a display of a cellular phone.

The electro-optical device shown in FIG. 1 includes an electro-optical panel 400 (a display panel), a wiring board 200, and a driver 100 (an integrated circuit device). The electro-optical panel 400 is composed of a liquid crystal display of an active matrix type such as a TFT. The electro-optical panel 400 may be composed of the liquid crystal display except for the active matrix type, or an organic electro luminescence (EL) panel. The wiring board 200 can be composed by using a printed circuit board such as a flexible substrate, and wiring lines such as a power supply line and a signal line of the electro-optical panel 400 and the driver 100 are formed thereon. The driver 100 is mounted on the wiring board 200, and receives signals through the wiring lines formed on the wiring board 200 and drives the electro-optical panel 400.

Specifically, on the wiring board 200, a ground wiring line VSF1 (a second power supply wiring line) and a power supply wiring line VDF (a first power supply wiring line) are wired. The ground wiring line VSF1 supplies power to the driver 100. The power supply wiring line VDF supplies power to a high-speed serial interface of the driver 100. A plurality of the grand wiring lines may be provided, and two grand wiring lines, VSF1 and VSF2, are wired in the structural example shown in FIG. 1. Further, on the wiring board 200, a first wiring line DPF, a second wiring line DMF, a first guard wiring line GF1, and a second guard wiring line GF2 are wired for transmitting signals to the driver 100. The wiring lines DPF and DMF are wired between the guard wiring lines GF1 and GF2.

Figure 14:
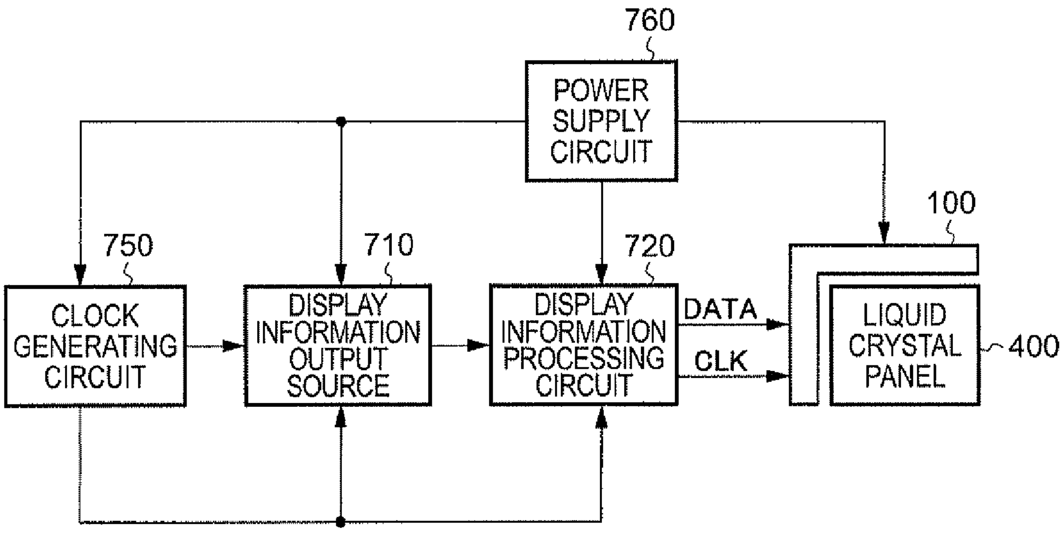
FIG. 14 is a structural example of an electronic apparatus of the embodiment.

The driver 100 communicates by using a display information processing circuit 720 shown in FIG. 14 and the high-speed serial interface. The display information processing circuit 720 will be described later. At this time, the driver 100 receives differential signals through the wiring lines DPF and DMF, and a ground voltage (a fixed voltage in a broad sense) is applied to the guard wiring lines GF1 and GF2 through the connector CN from the electronic substrate of the projector.

In addition, the driver 100 can communicate by using a parallel interface. At this time, an interface circuit of the driver 100 may include I/O buffers, and can transmit and receive CMOS level signals through the wiring lines GF1, DPF, DMF, and GF2.

The driver 100 is corresponded to both the high-speed serial interface and the parallel interface so that the interface can be selective in accordance with a required communication speed. In this case, utilizing terminals for a serial bus and a CMOS level signal in common allows reducing the number of terminals and an area.

Here, the differential signal of the high-speed serial interface is received at a receiver circuit. The receiver circuit includes a terminating resistor, and the differential signal is terminated at the terminating resistor. At this time, if the terminals are shared with the parallel interface, the terminating resistor causes a load when the CMOS level signal is inputted in a parallel interface mode.

In addition, if the terminals are shared, the CMOS level signal is inputted into a terminal to which a guard line of the serial bus is coupled in the parallel interface mode. Accordingly, the I/O buffer of the parallel interface is necessarily corresponded to the guard line in the high-speed serial interface mode.

2. High-Speed Serial Interface/Parallel Interface Switching Circuit

Figure 2:
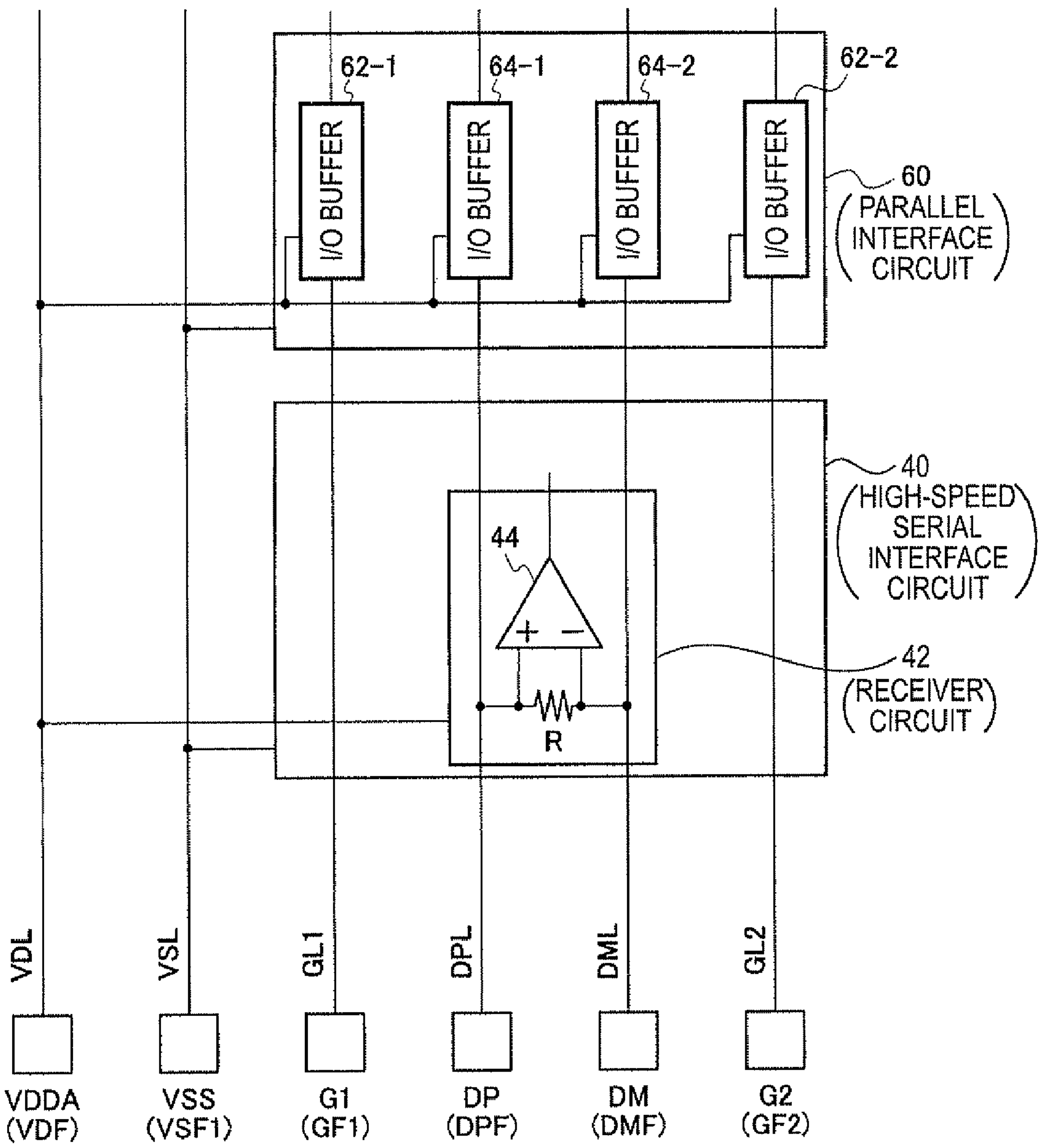
FIG. 2 is a structural example of an integrated circuit device of the embodiment.

FIG. 2 shows a structural example of an integrated circuit device of the embodiment which can solve these problems. The integrated circuit of the embodiment includes a first guard terminal G1, a second guard terminal G2, a first terminal DP, and a second terminal DM. Then, the terminals DP and DM are provided between the guard terminals G1 and G2.

Specifically, in the high-speed serial interface mode, the guard terminals G1 and G2 are used to prevent radiation, and a first signal included in the differential signal is inputted into the terminal DP and a second signal included in the differential signal is inputted into the terminal DM. That is, the differential signals are inputted into the terminals DP and DM through the wiring lines DPF, and DMF shown in FIG. 1, and the guard wiring lines GF1 and GF2 shown in FIG. 1 are coupled to the guard terminals G1 and G2 and fixed to the ground voltage. On the other hand, in the parallel interface mode, the CMOS level signals are inputted into the terminals DP, DM, G1, and G2 through the wiring lines DPF, DMF, GF1, and GF2 shown in FIG. 1.

In addition, the embodiment shown in FIG. 2 includes a parallel interface circuit 60. The parallel interface circuit 60 includes I/O buffers 62-1, 62-2, 64-1, and 64-2. Then, in the parallel interface mode, the I/O buffers 62-1 and 62-2 input and output the CMOS level signals through the terminals G1 and G2, and the I/O buffers 64-1 and 64-2 input and output the CMOS level signals through the terminals DP and DM. On the other hand, in the high-speed serial interface mode, outputs of the I/O buffers 62-1 and 62-2 are set to the ground voltage (a low-voltage-side level) or a high impedance state.

Further, the integrated circuit device of the embodiment includes a high-speed serial interface circuit 40, a receiver circuit power supply terminal VDDA, and a low-voltage-side power supply terminal VSS. The high-speed serial interface circuit 40 includes a receiver circuit 42 which receives the differential signal through the serial bus. In addition, to the power supply terminal VDDA, a power supply voltage of the receiver circuit 42 (a power supply voltage applied to a high-voltage side) is supplied and the power supply wiring line VDF shown in FIG. 1 is coupled. To the low-voltage-side power supply terminal VSS (a power supply voltage applied to a low-voltage side), the ground voltage (a power supply voltage applied to a low-voltage side) is supplied and the ground wiring line VSF1 is coupled. Besides the terminal VSS, a ground terminal to which the ground wiring line VSF2 is coupled may be provided.

For example, the receiver circuit 42 includes a terminating resistor R and a differential amplifier 44 as shown in FIG. 2. The terminating resistor R is provided between a wiring line DPL extending from the terminal DP and a wiring line DML extending from the terminal DM, and a voltage generated at both ends of the terminating resistor R by the differential signals inputted into the terminals DP and DM is inputted into the differential amplifier 44.

Figure 3A:
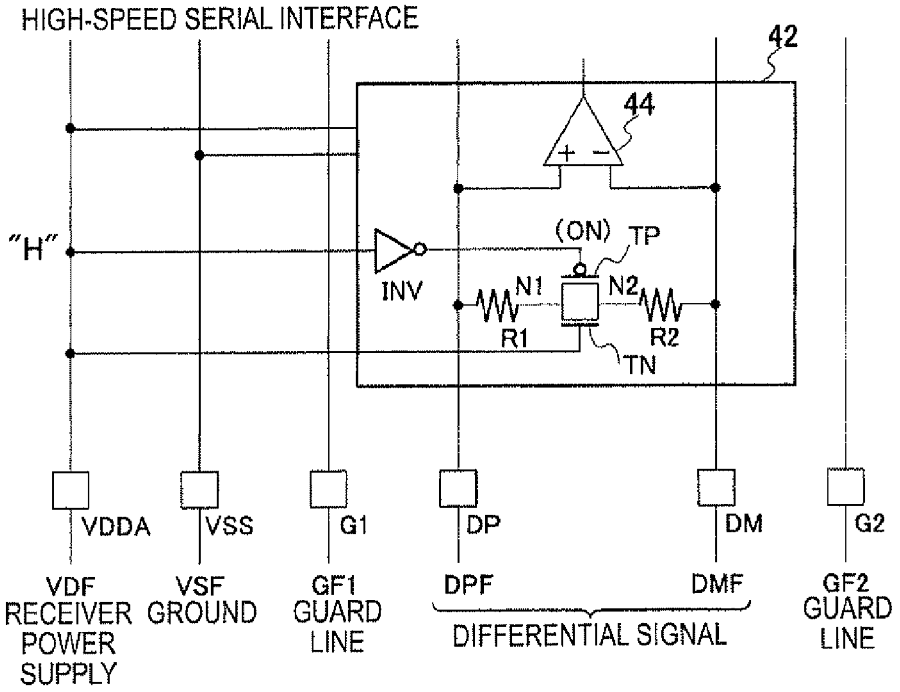
FIGS. 3A and 3B are structural examples of a receiver circuit.
Figure 3B:
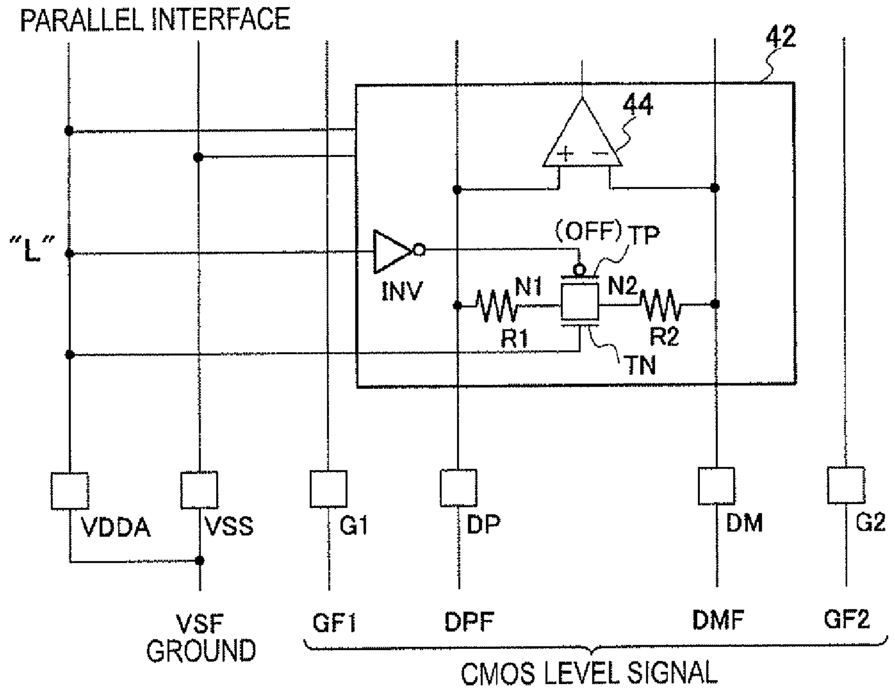

A specific structural example of the receiver circuit 42 is shown in FIGS. 3A and 3B. In the structural example, the terminating resistor R is set to an open state in the parallel interface mode. Specifically, the receiver circuit 42 includes a first terminating resistor R1, a second terminating resistor R2, a switching element, and an inverter INV. The terminating resistors R1 and R2, and the switching element correspond to the terminating resistor R in FIG. 2. The terminating resistor R1 is provided between the terminal DP and a fist node N1, and the terminating resistor R2 is provided between the terminal DM and a second node N2. Then, the switching element is provided between the nodes N1 and N2. The switching element is turned on/off by using a power supply voltage from the receiver circuit power supply terminal VDDA. Here, the switching element may be turned on/off by a power supply voltage of the receiver circuit 42 itself, and also be turned on/off based on a voltage generated from the power supply voltage of the receiver circuit 42.

Specifically, the switching element can be composed of a transfer gate of a COMS transistor, for example. The transfer gate may be composed of an N-type transistor TN (a first conductivity type transistor) and a P-type transistor TP (a second conductivity type transistor). Here, the voltage from the receiver circuit power supply terminal VDDA is applied to the inverter INV, and an output from the inverter is inputted into a gate of the transistor TP. On the other hand, the voltage from the receiver circuit power supply terminal VDDA is inputted into a gate of the transistor TN.

Then, as shown in FIG. 3A, in the high-speed serial interface mode, the power supply voltage of the receiver circuit 42 is supplied to the terminal VDDA, and the transistors TP and TN are turned on. On the other hand, as shown in FIG. 3B, in the parallel interface mode, since the receiver circuit 42 is not used, the ground voltage is supplied to the terminal VDDA. Thus, the transistors TP and TN are turned off.

If the terminals are shared in the high-speed serial interface and the parallel interface, the I/O buffer of the parallel interface circuit is necessarily corresponded to the guard line of the serial bus.

In regard to this point, in the embodiment, outputs of the I/O buffers 62-1 and 62-2 in the high-speed serial interface mode are set to the ground voltage or the high impedance state. Accordingly, sharing the terminals and switching the interface can be realized.

In addition, in the parallel interface mode, the terminating resistor causes the load of the CMOS level signal.

In regard to this point, in the embodiment, the terminating resistor is opened by using the switching element in the parallel interface mode. Thus, the terminating resistor can be prevented from causing the load in the parallel interface mode. Further, since the switching element is turned on/off by using the power supply voltage of the receiver circuit 42, the interface can be switched without an additional signal or terminal for switching the interface.

Here, if a semiconductor substrate is a P-type (a second conductivity type) for example, the P-type transistor TP included in a switching element is formed on an N-type well (a first conductivity type well). At this time, in the parallel interface mode, since the receiver circuit power supply terminal VDDA is set to the grand voltage, a potential of the N-type well cannot set to the voltage of the terminal VDDA.

3. N-Type Well of Terminating Resistor

The problem of the N-type well above will be described with reference to FIGS. 4A and 4B. Here, only the transistor TP included in a switching element is shown and the transistor TN is omitted in FIG. 4A. Similarly, the transistor TN will be omitted in FIGS. 5A and 5B described later.

Figure 4A:
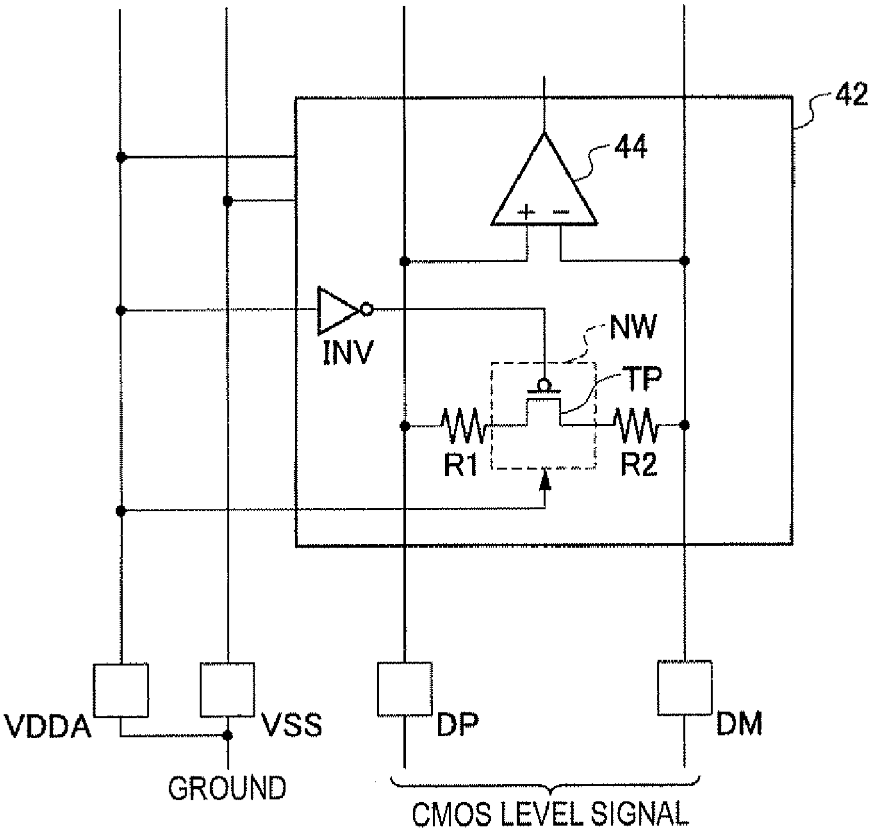
FIGS. 4A and 4B are schematic views for explaining a problem of a terminating resistor.
Figure 4B:
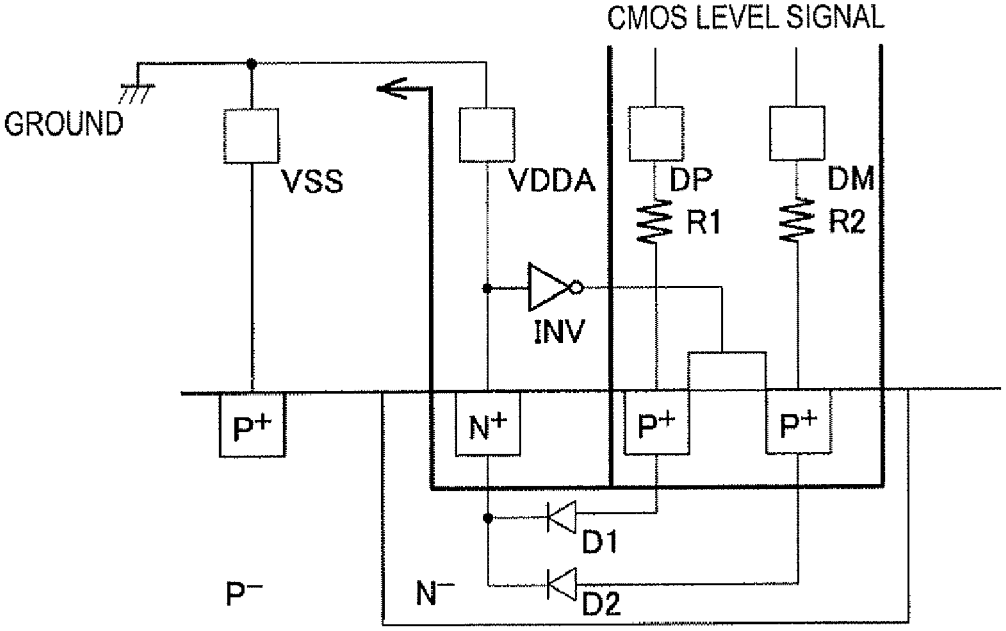

FIG. 4A shows a connection example in the parallel interface mode when the N-type well is fixed to the voltage from the terminal VDDA. Specifically, since the ground voltage is supplied to the terminal VDDA, the P-type transistor TP is turned off, and a potential of an N-type well NW is set to the ground voltage from the terminal VDDA. FIG. 4B shows a vertical structure of the transistor TP shown in FIG. 4A. As shown in FIG. 4B, between a source of the transistor TP and the N-type well NW and between a drain and the N-type well NW, parasitic diodes D1 and D2 exist. Therefore, if the N-type well NW is set to the ground voltage as the connection example, the diodes D1 and D2 are turned on when voltages of the source and the drain of the transistor TP become a threshold amount or more. That is, when the CMOS level signals are inputted into the terminals DP and DM in the parallel interface mode, since the diodes D1 and D2 are turned on, the terminals DP and DM are coupled to the ground through the diodes D1 and D2. Therefore, the CMOS level signals cannot be inputted into the parallel interface circuit 60 through the terminals DP and DM.

Figure 5A:
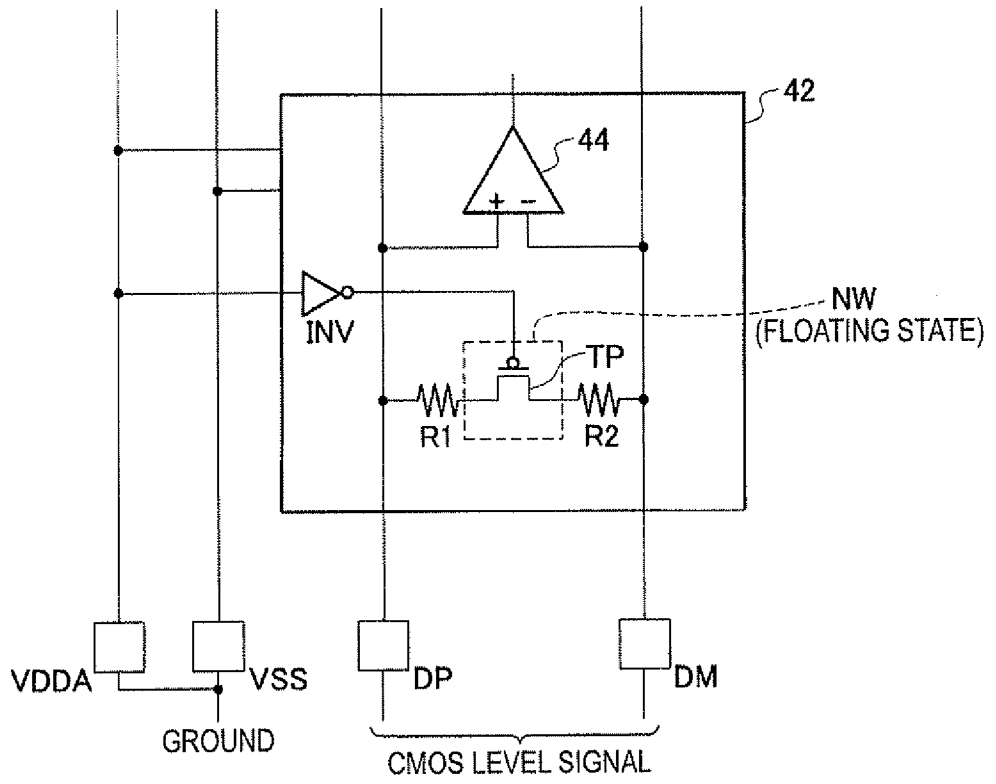
FIG. 5A is a first structural example of the terminating resistor.

FIG. 5A shows a first structural example of the embodiment which can solve the problem. FIG. 5A shows a connection example in the parallel interface mode in regard to the first structural example. The first structural example includes the P-type transistor TP (a second conductivity type transistor) formed on the N-type well NW (a first conductivity type well) as a switching element. Then, the N-type well NW is set in the floating state in both the high-speed serial interface mode and the parallel interface mode.

Figure 5B:
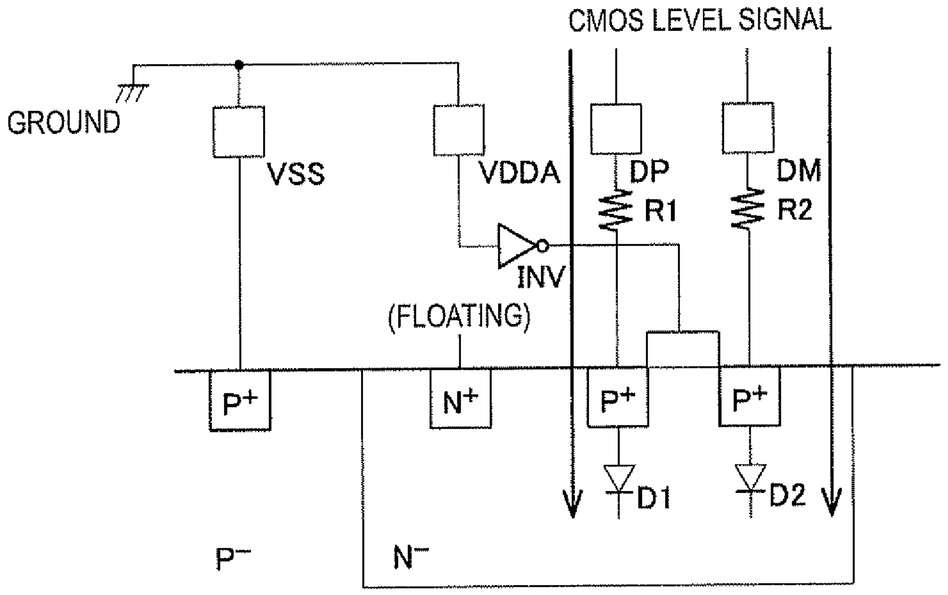
FIG. 5B is a vertical structure of a transistor.

FIG. 5B shows a vertical structure of the transistor TP shown in FIG. 5A. In FIG. 5B, between the source/drain and the N-type well NW, the parasitic diodes D1 and D2 exist in the same manner as FIG. 4B. However, since the N-type well NW is set in the floating state, unlike a case shown in FIG. 4B, the terminals DP and DM are not coupled to the ground through the diodes D1 and D2 even the CMOS level signals are inputted thereinto. For example, in an initial state before the CMOS level signals are inputted into the terminals DP and DM, the N-type well NW is assumed to be the ground voltage. At that time, if the CMOS level signals are inputted into the terminals DP and DM, the diode D1 is turned on as an active level is inputted into the terminal DP, and similarly, the diode D2 is turned on as an active level is inputted into the terminal DM. Accordingly, the potential of the N-type well NW is gradually increased. Thereafter, when the potential of the N-type well NW becomes the same as the active level, the potential is maintained by a parasitic capacitance between the well and a substrate, and the potential of the N-type well NW is maintained at an active level of the CMOS level signal. Therefore, the parasitic diode D1 and D2 are not turned on, and the CMOS level signals can be inputted into the terminals DP and DM in the parallel interface mode.

Figure 6A:
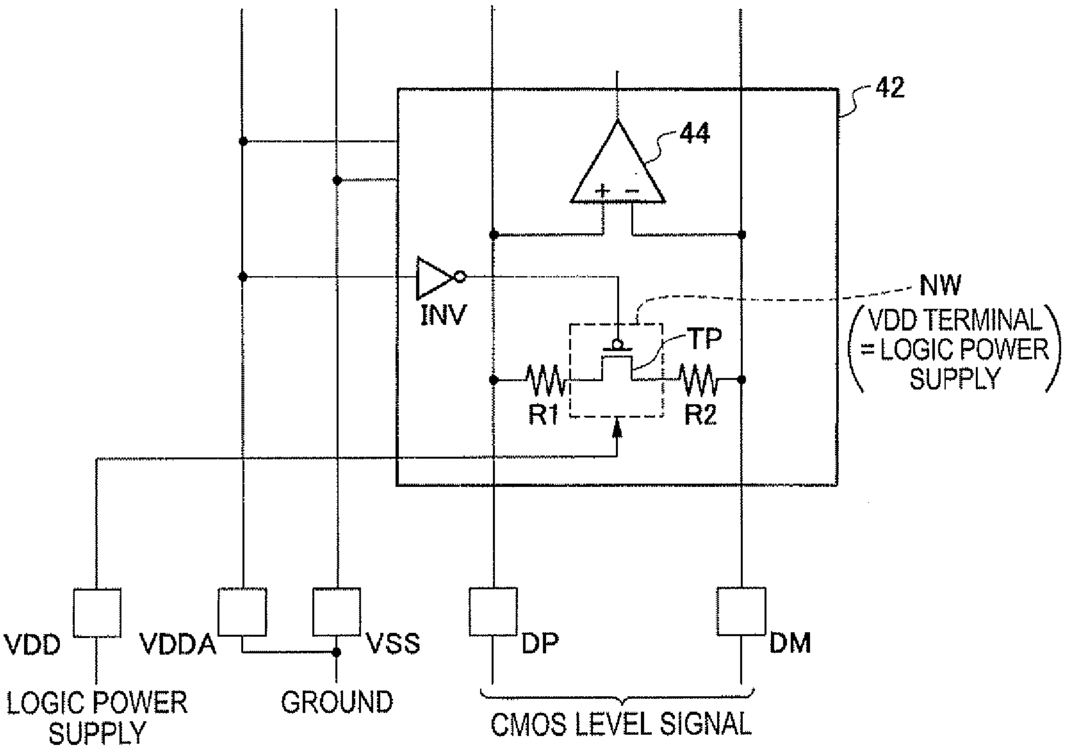
FIG. 6A is a second structural example of the terminating resistor.

FIG. 6A shows a second structural example of the embodiment. FIG. 6A shows a connection example in the parallel interface mode in regard to the second structural example. The second structural example includes the P-type transistor TP (a second conductivity type transistor) formed on the N-type well NW (a first conductivity type well) as a switching element. Then, the N-type well NW is fixed to a power supply voltage of a logic circuit (a power supply voltage applied to a high-voltage side of a logic circuit) in both the high-speed serial interface mode and the parallel interface mode. The power supply voltage of the logic circuit is supplied to a logic circuit power supply terminal VDD, and used for logic sections of the parallel interface circuit 60 and the high-speed serial interface circuit 40, for example. Then, in both the high-speed serial interface mode and the parallel interface mode, the power supply voltage of the logic circuit is supplied to the logic circuit power supply terminal VDD.

Figure 6B:
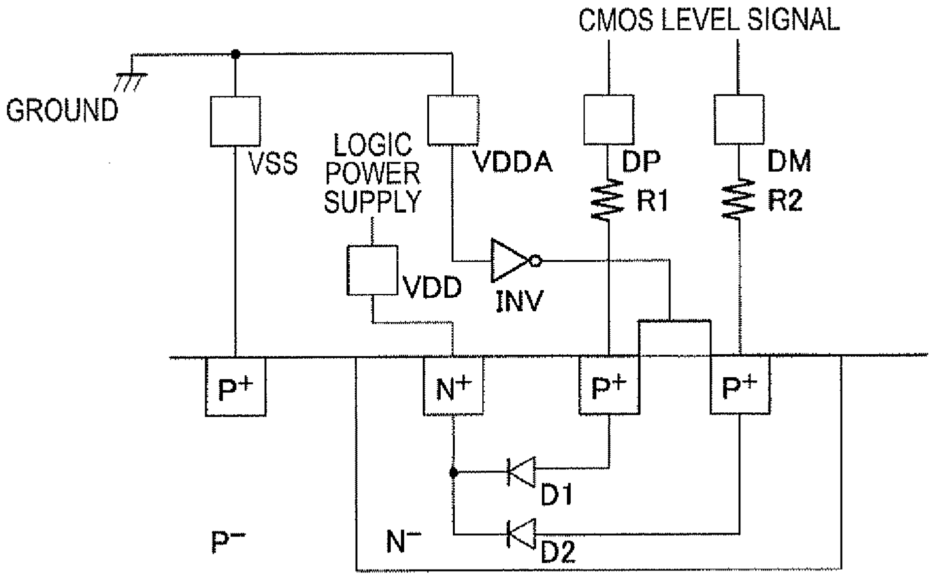
FIG. 6B is a vertical structure of the transistor.

FIG. 6B shows a vertical structure of the transistor TP shown in FIG. 6A. In the second structural example, since the N-type well NW is set to the power supply voltage of the logic circuit and voltages of the CMOS level signals inputted into the terminals DP and DM are the power supply voltage of the logic circuit or less, the diodes D1 and D2 are not turned on. Therefore, in the parallel interface mode, the CMOS level signals can be inputted into the terminals DP and DM.

In the parallel interface mode, since the receiver circuit power supply terminal VDDA is set to the grand, forward parasitic diodes exists between the terminals DP, DM and the ground in the transistor provided at the terminating resistor. Therefore, the CMOS level signals cannot be inputted into the terminals DP and DM.

In regard to this point, in the embodiment, the potential of the N-type well NW of the transistor TP is set in the floating state or the power supply voltage of the logic circuit. Accordingly, the parasitic diodes are not turned on even the CMOS level signals are inputted into the terminals DP and DP. As a result, the CMOS level signals can be inputted thereinto. Thus, the switching element can be provided at the terminating resister, and the terminating resistor can be prevented from causing the load in the parallel interface mode.

Here, in the first and the second structural examples above, an on/off of the transistor TP is controlled based on an output of the inverter INV. The inverter INV operates with the power supply voltage of the logic circuit. Therefore, the power supply voltage is supplied to the inverter INV in the parallel interface mode, and the transistor TP can be turned off. Then, the P-type transistor (a second conductivity type transistor) included in the inverter INV may be formed on the N-type well NW with the transistor TP.

4. Parallel Interface Circuit 4-1. First Structural Example

A first structural example of the parallel interface circuit 60 is shown in FIG. 2. The first structural example includes the I/O buffers 62-1 (a first I/O buffer), 62-2 (a second I/O buffer), 64-1) and 64-2. The I/O buffers are respectively coupled to the terminals G1, G2, DP, and DM. Then, in the high-speed serial interface mode, outputs of the I/O buffers 62-1 and 62-2 are set to the ground (a low-potential-side level, a fixed level) or the high impedance state. On the other hand, in the parallel interface mode, the I/O buffers 62-1 and 62-2 input and output the CMOS level signals through the terminals G1 and G2. Thus, switching the interface and sharing the terminals corresponding to the guard terminals are realized.

Hereafter, structural examples of the I/O buffers 62-1 and 62-2 will be described. Since structures of the I/O buffers 62-1 and 62-2 are the same, only the I/O buffer 62-1 will be described. In addition, though the I/O buffers 64-1 and 64-2 will not be described here, they will be described in a second structural example with reference to FIG. 8.

Figure 7A:
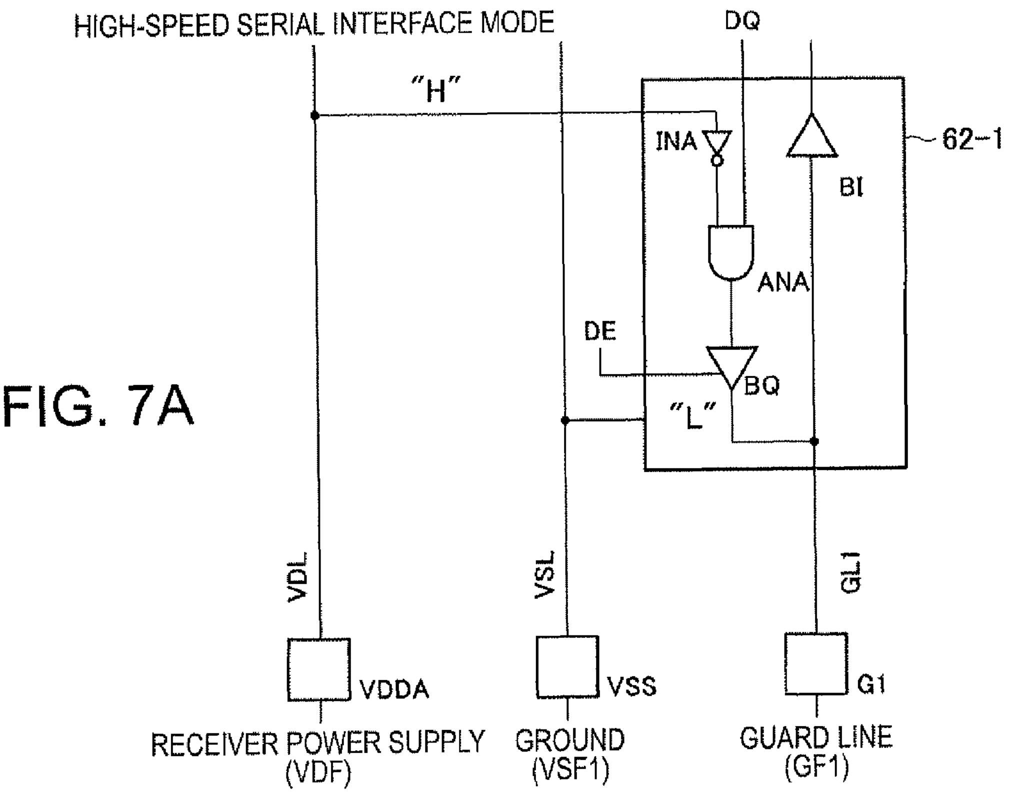
FIGS. 7A and 7B show a first structural example of an I/O buffer.
Figure 7B:
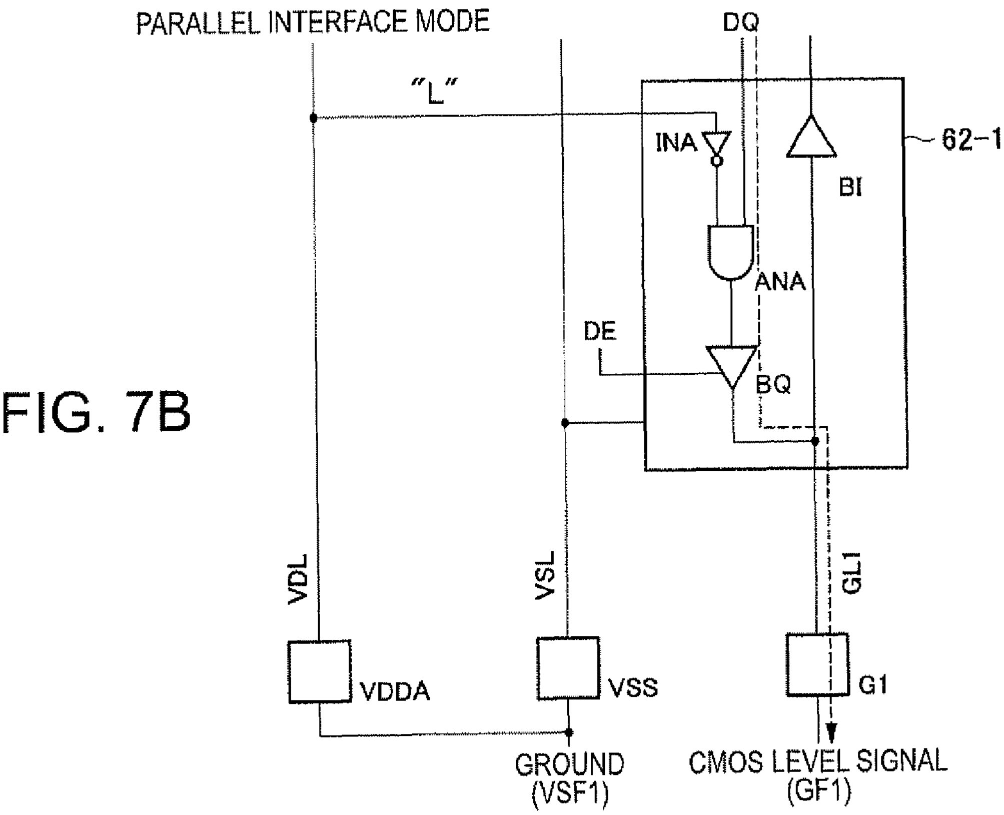

A first structural example of the I/O buffer 62-1 is shown in FIGS. 7A and 7B. The I/O buffer 62-1 shown in FIGS. 7A and 7B includes an input buffer BI, an output buffer BQ, and a logic circuit. The logic circuit is provided at a previous stage of the output buffer BQ, and includes an AND circuit ANA and an inverter INA.

Then, as shown in FIG. 7A, in the high-speed serial interface mode, the logic circuit outputs a low-potential-side level (a fixed level in a broad sense) based on the power supply voltage of the receiver circuit 42 supplied to the power supply terminal VDDA. Specifically, the power supply voltage of the receiver circuit 42 is inputted into the inverter INA. That is, since the voltage corresponding to a high-potential-side level (H) is inputted into the inverter INA, the inverter INA outputs a low-potential-side level (L). Then, an output of the inverter INA and an output signal DQ are inputted into the AND circuit ANA, and the AND circuit ANA outputs the low-potential-side level (L) regardless of the output signal DQ. The output buffer BQ outputs the low-potential-side level (L) in response to the output of the AND circuit ANA.

On the other hand, as shown in FIG. 7B, in the parallel interface mode, the ground voltage is supplied to the power supply terminal VDDA. It is because the power supply voltage of the receiver circuit 42 is unnecessary in the parallel interface mode. In this case, since the voltage corresponding to the low-potential-side level (L) is inputted into the inverter INA, the inverter INA outputs the high-potential-side logic level (H). Therefore, the AND circuit ANA outputs the output signal DQ, and the output buffer BQ outputs the output signal DQ to the wiring line GF1 through the terminal G1.

Figure 9:
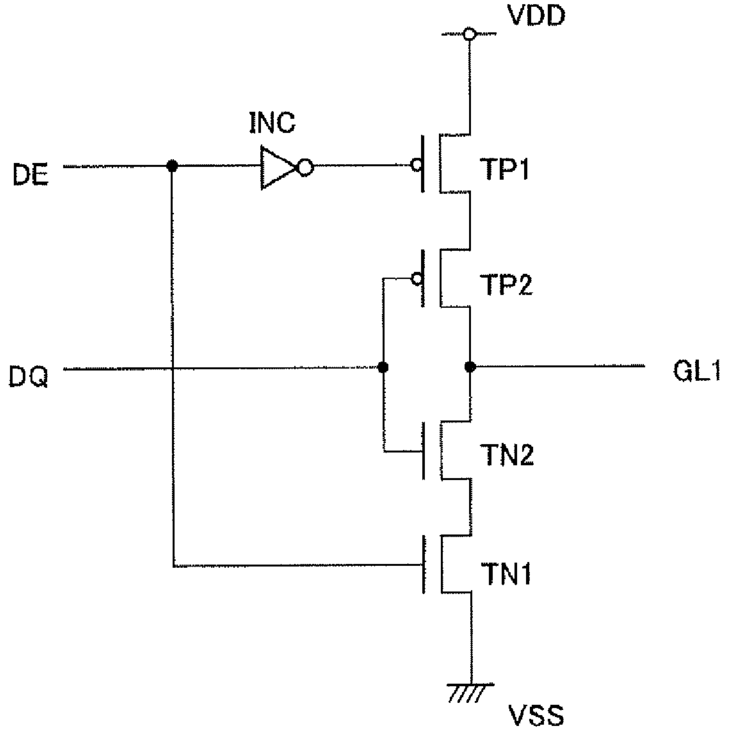
FIG. 9 is a structural example of an output buffer of the I/O buffer.

In addition, the I/O buffer 62-1 controls an input and an output by an output enable signal DE. For example, when the output enable signal DE is active, the output buffer BQ buffers and outputs the output signal DQ. On the other hand, when the output enable signal DE is non-active, the output buffer BQ is set to the high impedance state, and the CMOS level signal is inputted into the input buffer BI through the terminal G1. The output buffer BQ may be composed of a clocked inverter as shown in FIG. 9.

Figure 8:
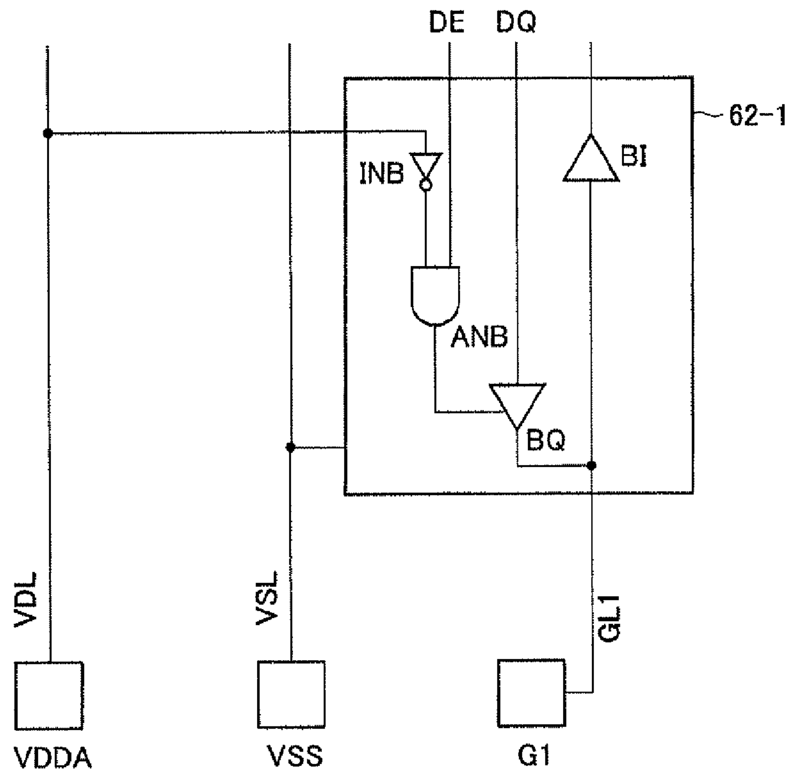
FIG. 8 is a second structural example of the I/O buffer.

The second structural example of the I/O buffer 62-1 is shown in FIG. 8. The structural example includes the input buffer BI, the output buffer BQ, an inverter INB, and an AND circuit ANB. An output of the inverter INB and the output enable signal DE are inputted into the AND circuit ANB. The output signal DQ is inputted into the output buffer BQ.

Specifically, in the high-speed serial interface mode, the inverter INB outputs the low-potential-side level. In response to this, the AND circuit ANB outputs the low-potential-side level (a fixed level in a broad sense) regardless of the output enable signal DE. Then, an output of the output buffer BQ is set to the high impedance state based on the output of the AND circuit ANB.

On the other hand, in the parallel interface mode, the inverter INB outputs the high-potential-side level. In response to this, the AND circuit ANB outputs the output enable signal DE. Then, an output of the output buffer BQ is set to the high impedance state, or the output buffer BQ outputs the output signal DQ based on the output of the AND circuit ANB. For example, when the output enable signal DE is active, the output buffer BQ outputs the output signal DQ. On the other hand, when the output enable signal DE is non-active, the output of the output buffer BQ is set to the high impedance state, and the CMOS level signal is inputted into the input buffer BI through the terminal G1.

If the terminals are shared in the high-speed serial interface mode and the parallel interface mode, an output of the I/O buffer is required to be switched.

In regard to this point, structural examples shown in FIGS. 7A, 7B, and 8 enable sharing the terminals to be realized. Therefore, the high-speed serial interface circuit and the parallel interface circuit can be provided without an additional terminal. This allows providing an integrated circuit device that prevents an increase of cost and realizes selection of the interface.

In the embodiment, the interface is switched by using the voltage supplied to the power supply terminal VDDA. This enables selection of the interface to be realized without an additional terminal or signal for controlling the I/O buffers.

4-2. Second Structural Example

Figure 10A:
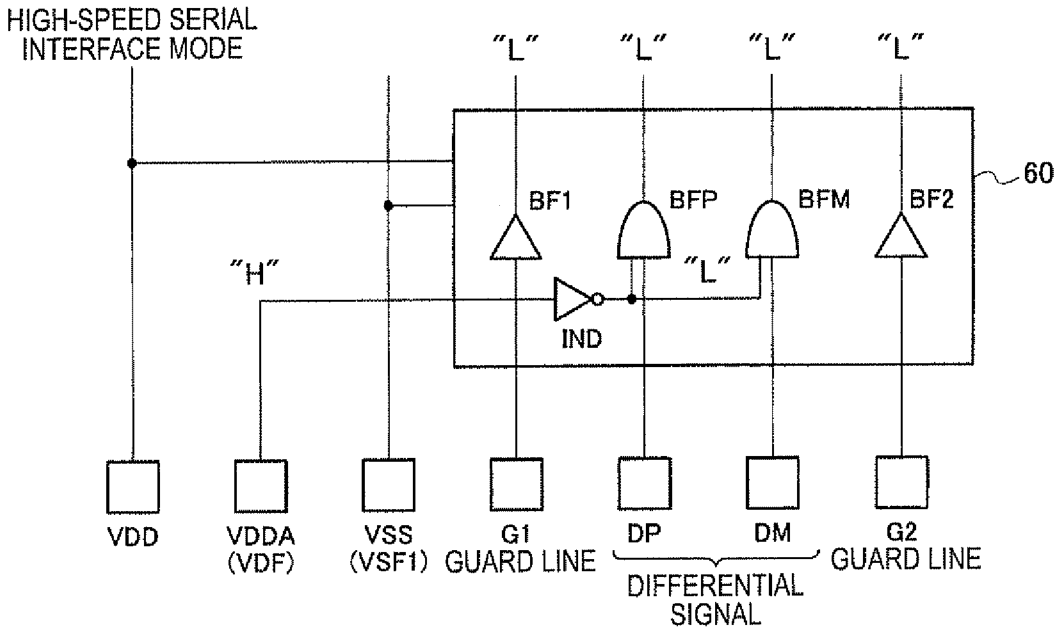
FIGS. 10A and 10B show a second structural example of a parallel interface circuit.
Figure 10B:
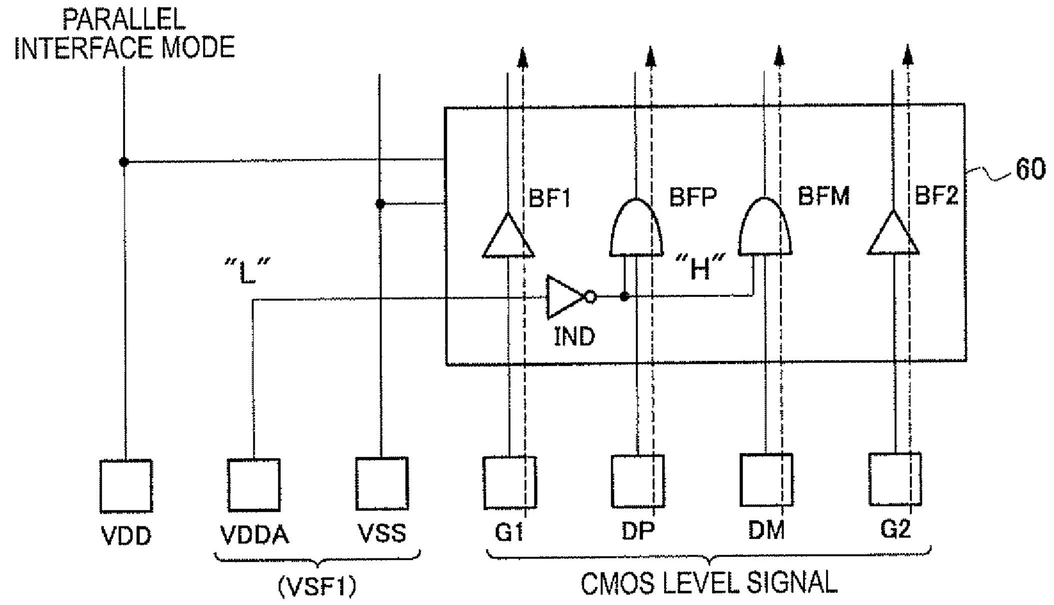

A second structural example of the parallel interface circuit 60 is shown in FIGS. 10A and 10B. The structural example includes a first and a second input buffers BFP and BFM. Signals from the terminals DP and DM are respectively inputted into the input buffers BFP and BFM. The second structural example may include an inverter IND into which the voltage from the terminal VDDA is inputted and input buffers BF1 and BF2 into which signals from the terminals G1 and G2 are inputted. Further, the second structural example may include the terminal VDD to which the power supply voltage of the logic circuit is supplied. Then, the input buffers BFP, BFM, BF1, and BF2, and the inverter IND operate with the power supply voltage of the logic circuit supplied from the terminal VDD.

Specifically, the input buffers BFP and BFM can be composed of an AND circuit. Then, outputs of the input buffers BFP and BFM are controlled by an output of the inverter IND and determined based on the voltage from the terminal VDDA.

More specifically, as shown in FIG. 10A, in the high-speed serial interface mode, the power supply voltage of the receiver circuit 42 is supplied to the terminal VDDA, and the inverter IND outputs a low-voltage-side logic level (L). Therefore, the input buffers BFP and BFM output low-voltage-side logic level signals (L, a fixed level in a broad sense). In addition, since the terminals G1 and G2 are fixed to the ground voltage with the guard wiring lines, outputs of the input buffers BF1 and BF2 are also fixed to the low-voltage-side logic level.

On the other hand, as shown in FIG. 10B, in the parallel interface mode, since power supply of a receiver circuit 42 is unnecessary, the ground voltage is supplied to the terminal VDDA. In this case, since the inverter IND outputs a high-voltage-side logic level (H), the input buffers BFP and BFM buffer and output the CMOS level signals that are respectively inputted thereinto through the terminals DP and DM. In the parallel interface mode, since the CMOS level signals (a first and a second interface signals) are also inputted into the terminals G1 and G2, the input buffers BF1 and BF2 output the CMOS level signals that are respectively inputted thereinto through the terminals G1 and G2.

The input buffers BFP and BFM shown in FIGS. 10A and 10B may be applied to the I/O buffers 64-1 and 64-2 shown in FIG. 2 and the like.

In the embodiment, the terminals are shared in the high-speed serial interface and the parallel interface. In this case, in the high-speed serial interface mode, since input buffers of the parallel interface circuit buffer high-speed serial signals, power consumption is increased.

In regard to this point, in the embodiment, the input buffers output a fixed voltage in the high-serial interface mode based on the voltage supplied to the terminal VDDA. As a result, an increase of the power consumption can be prevented. That is, a buffered high frequency signal is inputted into a logic circuit of a subsequent stage of the parallel interface circuit so that power consumption can be prevented in the logic circuit which normally should not be in use in the high-speed serial interface mode. Further, by a use of the power supply of a receiver circuit 42, switching the interface without an additional control terminal or control signal is realized.

5. High-Speed Serial Interface Circuit

Figure 11:
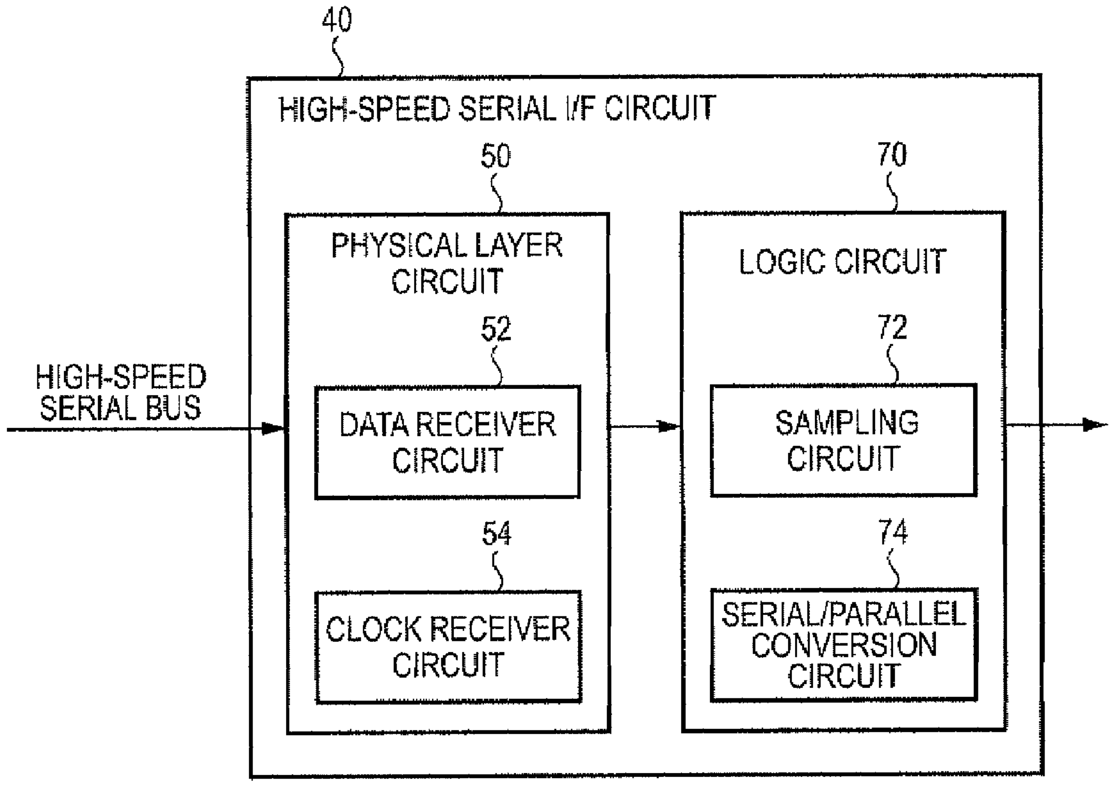
FIG. 11 is a structural example of a high-speed serial interface circuit.

A specific structural example of the high-speed serial interface circuit 40 is shown in FIG. 11. The high-speed serial interface circuit 40 includes a physical layer circuit 50 and a logic circuit 70.

The physical layer circuit 50 (a receiver) receives data (a packet) and a clock by using the differential signal (a differential data signal, a differential clock signal). Specifically, the physical layer circuit 50 receives the data and the like from a differential signal line of a current-driven or a voltage-driven serial bus. The physical layer circuit 50 may include a data receiver circuit 52, a clock receiver circuit 54, and the like. The data receiver circuit 52 and the clock receiver circuit 54 correspond to the receiver circuit 42 of the embodiment. The physical layer circuit 50 may include a transmitter circuit. In that case, the physical layer circuit 50 can also send the data and the clock.

The logic circuit 70 performs an interface process between the high-speed serial interface circuit 40 and an internal circuit of the driver. Specifically, the logic circuit 70 may include a sampling circuit 72 and a serial/parallel conversion circuit 74. The sampling circuit 72 samples a data signal from the data receiver circuit 52 with a clock from the clock receiver circuit 54 to generate serial data. The serial/parallel conversion circuit 74 converts the serial data into parallel data to output to the internal circuit of the driver. Further, the logic circuit 70 may include a link controller to perform a link layer process for a link layer which is an upper layer of the physical layer.

6. Specific Structural Example of Electro-Optical Device

Figure 12:
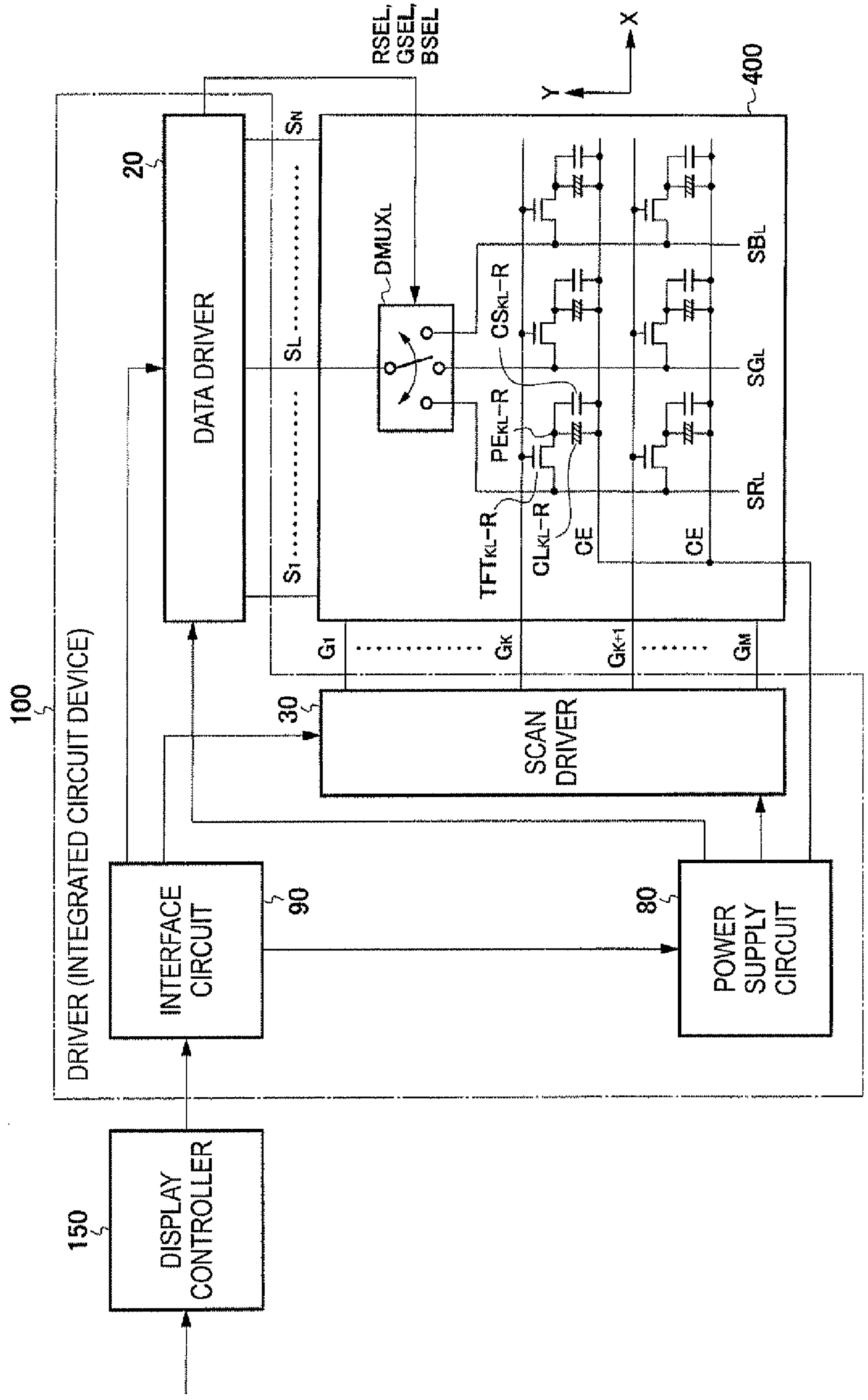
FIG. 12 is a specific structural example of an electro-optical device of the embodiment.

A specific structural example of an electro-optical device of the embodiment is shown in FIG. 12. In FIG. 12, a case will be explained in which the electro-optical device according to the embodiment is applied to a liquid crystal display device. However, the electro-optical device according to the embodiment may be applied to a display using a light emitting element such as an EL element and the like.

The liquid crystal display device (an electro-optical device, a display) of the embodiment shown in FIG. 12 includes a liquid crystal panel 400 (an electro-optical panel, a display panel), a data driver 20 (a data line drive circuit), a scan driver 30 (a scan line drive circuit, a gate driver), a power supply circuit 80, and a display controller 150. Here, the high-speed serial interface circuit 40 and the parallel interface circuit 60 of the embodiment are included in an interface circuit 90. It should be noted that not all of these components in this circuit block are required to form the embodiment, and a part of them can be omitted.

The liquid crystal panel 400 is formed on an active matrix substrate (e.g., a glass substrate), for example. On the active matrix substrate, thin film transistors $TFT_{KL}$-R, $TFT_{KL}$-G, and $TFT_{KL}$-B are provided at positions corresponding to intersections of a gate line $G_K$ ($1 \leqq K \leqq M$, K and M are a natural number) and data lines $SR_L$, $SG_L$, and $SB_L$ ($1 \leqq L \leqq N$, L and N are a natural number).

For example, the $TFT_{KL}$-R has a gate coupled to the gate line $G_K$, and a source and a drain coupled to the data line $SR_L$ and a pixel electrode $PE_{KL}$-R. Liquid crystal (an electro-optical substance) is sandwiched between the pixel electrode $PE_{KL}$-R and a counter electrode CE (a common electrode), and a liquid crystal capacitance $CL_{KL}$-R and an auxiliary capacitance $CS_{KL}$-R are formed therebetween.

Further, data voltage supply lines $S_1$ to $S_N$ are provided on the active matrix substrate, and demultiplexers are provided corresponding to each of the lines $S_1$ to $S_N$. A demultiplexer $DMUX_L$ divides a gray scale voltage supplied to a source voltage supply line SL in a time-division manner and supplies to data lines $SR_L$, $SG_L$, and $SB_L$ based on a multiplex control signal from the data driver 20.

In addition, a voltage level of a counter electrode voltage VCOM applying to the counter electrode CE is generated by a counter electrode voltage generating circuit included in the power supply circuit 80. For example, the counter electrode CE is entirely formed on a counter substrate.

The data driver 20 drives the data lines $S_1$ to $S_N$ of the liquid crystal panel 400 based on gray scale data. As described above, since the demultiplexer divides the gray scale voltage supplied to the source voltage supply line $S_L$ in a time-division manner and supplies them to data lines, the data driver 20 can drive the data lines $SR_1$ to $SR_N$, $SG_1$ to $SG_N$, and $SB_1$ to $SB_N$. On the other hand, the scan driver 30 scans (sequentially scans) scan lines $G_1$ to $G_M$ of the liquid crystal panel 400.

The display controller 150 outputs a control signal to the interface circuit 90 for the data driver, the scan driver 30, and power supply circuit 80 based on the content set by a host such as a central processing unit (CPU) not shown in the drawing.

The interface circuit 90 interfaces the control signal inputted from the display controller 150 to the data driver 20, the scan driver 30, and the power supply circuit 80.

The power supply circuit 80 generates various kinds of voltage levels (gray scale voltages) required for driving the liquid crystal panel 400 and a voltage level of the counter electrode VCOM of the counter electrode CE based on a reference voltage supplied externally.

In FIG. 2, though the display controller 150 is included in the liquid crystal display device, the display controller 150 may be provided outside the liquid crystal device. Further, a part or the whole of the data driver 20, the scan driver 30, the power supply circuit 80, and the display controller 150 may be formed on the liquid crystal panel 400.

6-1. Data Driver

Figure 13:
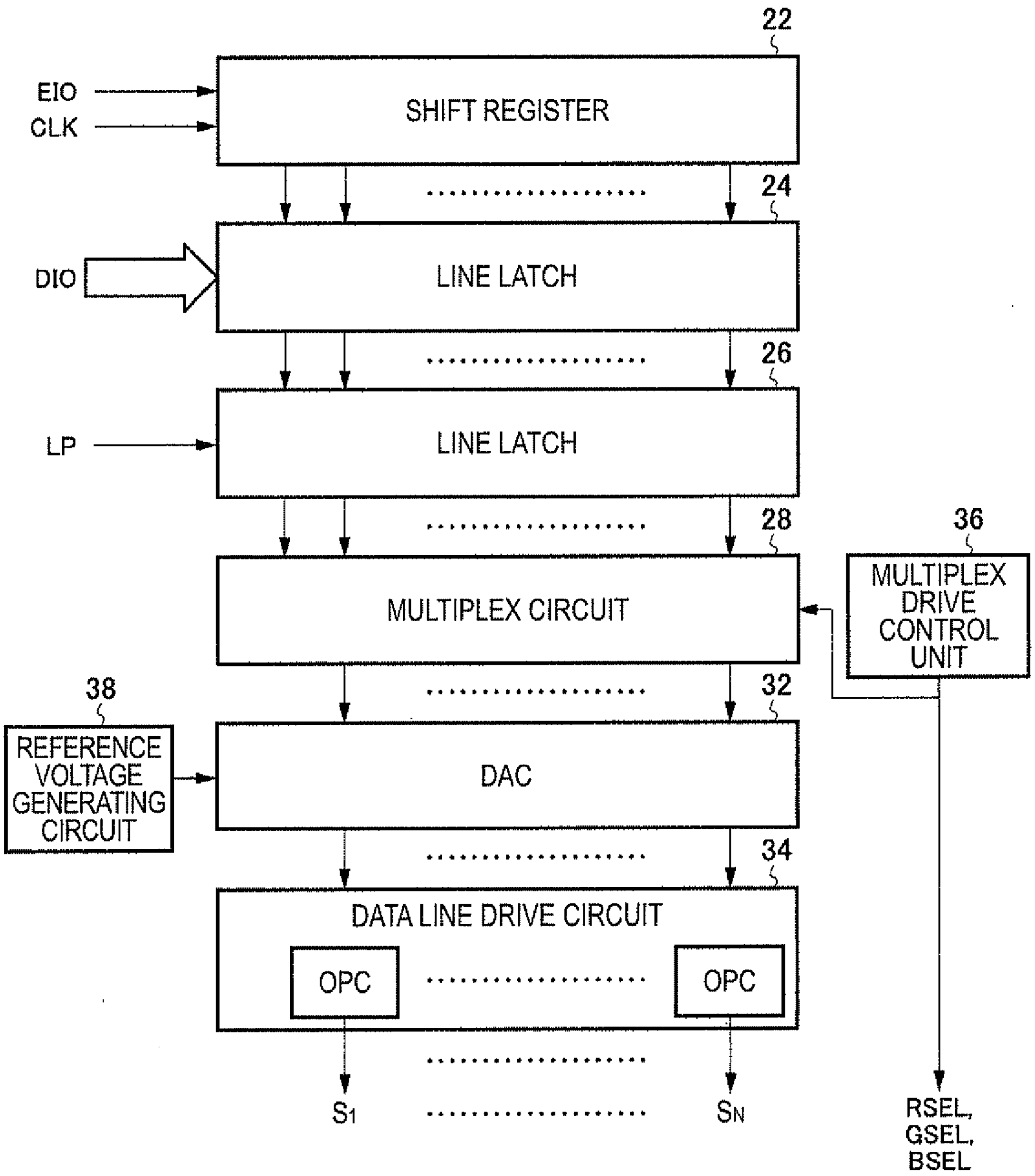
FIG. 13 is a structural example of a data driver.

FIG. 13 shows a structural example of the data driver 20 shown in FIG. 12. The data driver 20 includes a shift register 22, line latches 24 and 26, a multiplex circuit 28, a reference voltage generating circuit 38, a data voltage generating circuit (a DAC) 32, a data line drive circuit 34, and a multiplex drive control unit 36.

The shift register 22 sequentially shifts an enable input/output signal EIO in synchronization with a clock signal to an adjacent flip-flop.

To the line latch 24, gray scale data DIO is inputted from the display controller 150, for example, in units of 18 bits (6 bits (gray scale data)×3 (each color of RGB)). The line latch 24 latches the gray scale data DIO in synchronization with the enable input/output signal EIO which is sequentially shifted by the shift resister 22.

The line latch 26 latches one horizontal scan unit of the gray scale data, which is latched by the line latch 24, in synchronization with a horizontal synchronization signal LP supplied from the display controller 150.

The multiplex circuit 28 performs time-division multiplexing of the gray scale data of three data lines that are latched in accordance with the respective data lines in the line latch 26.

The multiplex drive control unit 36 generates the multiplex control signal that determines time-division timing of the data voltage supply lines, and sequentially activates multiplex control signals RSEL, GSEL, and BSEL within one horizontal scan period. The multiplex circuit 28 performs multiplexing based on the multiplex control signal to supply the data voltage supply lines with the gray scale voltage in a time-division manner. The multiplex control signal is also supplied to the demultiplexer of the liquid crystal panel 400.

The reference voltage generating circuit 38 generates 64 kinds of reference voltages, for example. The 64 kinds of reference voltages generated by the reference voltage generating circuit 38 are supplied to the DAC 32.

The DAC 32, based on digital gray scale data from the multiplex circuit 28, selects any of the reference voltages from the reference voltage generating circuit 38 and outputs an analog data voltage corresponding to the digital gray scale data to the respective data lines.

Operational amplifiers OPC in voltage follower connection provided for the respective data lines buffer a data voltage from the DAC 32 and output to the data lines, thereby the data line drive circuit 34 drives the data lines.

In addition, while structure in FIG. 13 is such that digital gray scale data is subjected to digital/analog conversion to be outputted to the data lines through the data line drive circuit 34, it may be also structured that an analog video signal may be put up for sample hold to be outputted to the data lines through the data line drive circuit 34.

7. Electronic Apparatus

A projector (a projection display device) is an electronic apparatus using the liquid crystal display device described above, for example. FIG. 14 is a block diagram showing a structural example of a projector employing the liquid crystal display device according to the embodiment.

The projector shown in FIG. 14 includes a display information output source 710, the display information processing circuit 720, the driver 100 (an integrated circuit device), the liquid crystal panel 400 (an electro-optical panel), a clock generating circuit 750, and a power supply circuit 760. The display information output source 710 includes a read only memory (ROM) and a random access memory (RAM), a memory such as an optical disk device, and a tuning circuit which synchronously outputs an image signal. Based on a clock signal from the clock signal generating circuit 750, display information such as an image signal in a predetermined format is outputted to the display information processing circuit 720. The display information processing circuit 720 may include an amplifier/polarity inversion circuit, a phase development circuit, a rotation circuit, a gamma correction circuit, a clamp circuit, and the like. The driver 100 includes a scan driver and a data driver, and drives the liquid crystal display 400. The power supply circuit 760 supplies power to the respective circuits described above.

While this embodiment has been described in detail above, it will be understood by those skilled in the art that a number of modifications can be made to this embodiment without substantially departing from new matters and advantages of this invention. Therefore, it is to be noted that these modifications are all included in the scope of the invention. For example, terms (the electro-optical device, the integrated circuit device, the electro-optical panel, the low-potential side power supply voltage, and the like) referred as broader or equivalent terms (the liquid crystal device, the driver, the liquid crystal panel, the ground, and the like) in the specification and drawings can be replaced with the broader or equivalent terms in any part of the specification and drawings. Also, structures and operations of the high-speed serial interface circuit, the parallel interface circuit, the data driver, the scan driver, the power supply circuits, the driver, the electro-optical device, electronic apparatus, and the like are not limited to what have been described in this embodiment and various modifications can be made thereto.

What is claimed is:

1. An integrated circuit device, comprising:

a high-speed serial interface circuit including a receiver circuit that receives a differential signal through a serial bus;

a first terminal into which a first signal included in the differential signal is inputted;

a second terminal into which a second signal included in the differential signal is inputted;

a receiver circuit power supply terminal to which a power supply voltage applied to a high-voltage side of the receiver circuit is supplied;

a first terminating resistor provided between the first terminal and a first node;

a second terminating resistor provided between the second terminal and a second node; and a switching element provided between the first and the second nodes, wherein the switching element is turned on in a high-speed serial interface mode and is turned off in a parallel interface mode by using the power supply voltage from the receiver circuit power supply terminal.

2. The integrated circuit device according to claim 1, wherein the switching element includes a second conductivity type transistor formed on a first conductivity type well, and a potential of the first conductivity type well is set in a floating state.

3. The integrated circuit device according to claim 2, further comprising an inverter into which a voltage from the receiver circuit power supply terminal is inputted and operates with a power supply voltage applied to a high-voltage side of a logic circuit, wherein the second conductivity type transistor is turned on in the high-speed serial interface mode and turned off in the parallel interface mode based on an output of the inverter.

4. The integrated circuit device according to claim 3, wherein the second conductivity type transistor of the inverter is formed on the first conductivity type well.

5. The integrated circuit device according to claim 2, wherein the first conductivity type well is an N-type well, and the second conductivity type transistor of the switching element is a P-type transistor.

6. The integrated circuit device according to claim 1, wherein the switching element includes a second conductivity type transistor formed on a first conductivity type well, and a potential of the first conductivity type well is fixed to a power supply voltage applied to a high-voltage side of a logic circuit.

7. The integrated circuit device according to claim 1, further comprising:

a first and a second guard terminals for preventing radiation in the serial bus;

a first I/O buffer that inputs and outputs a parallel interface signal through the first guard terminal; and a second I/O buffer that inputs and outputs a parallel interface signal through the second guard terminal, wherein each output of the first and the second I/O buffers in the high-speed serial interface mode is set to a low-voltage-side level or a high impedance state based on a voltage from the receiver circuit power supply terminal.

8. The integrated circuit device according to claim 7, wherein each of the first and the second I/O buffers includes an input buffer, an output buffer, and a logic circuit, wherein the logic circuit is provided at a previous stage of the output buffer and outputs a fixed level signal based on a voltage from the receiver circuit power supply terminal in the high-speed serial interface mode, and the output buffer outputs the low-voltage-side level if the fixed level signal of the logic circuit is inputted.

9. The integrated circuit device according to claim 7, wherein each of the first and the second I/O buffers includes an input buffer, an output buffer, and a logic circuit, wherein the logic circuit outputs a fixed level signal based on a voltage from the receiver circuit power supply terminal in the high-speed serial interface mode, and an output of the output buffer is set to the high-impedance state based on the fixed level signal of the logic circuit.

10. The integrated circuit device according to claim 1, further comprising a first input buffer into which a parallel interface signal is inputted through the first terminal and a second input buffer into which a parallel interface signal is inputted through the first terminal, wherein each of the first and the second input buffers outputs a fixed level signal based on a voltage from the receiver circuit power supply terminal.

11. The integrated circuit device according to claim 10, further comprising an inverter that operates with a logic circuit power supply voltage which is different from the power supply voltage applied to the high-voltage side of the receiver circuit, wherein the power supply voltage applied to the high-voltage side of the receiver circuit that is supplied to the receiver circuit power supply terminal is inputted into the inverter, and an output of the inverter controls the first and the second input buffers.

12. The integrated circuit deceive according to claim 1, wherein a power supply voltage applied to a low-voltage side is supplied to the receiver circuit power supply terminal in the parallel interface mode.

13. An electro-optical device, comprising:

an integrated circuit device including:

a high-speed serial interface circuit including a receiver circuit that receives a differential signal through a serial bus;

a first terminal into which a first signal included in the differential signal is inputted;

a second terminal into which a second signal included in the differential signal is inputted;

a receiver circuit power supply terminal to which a power supply voltage applied to a high-voltage side of the receiver circuit is supplied;

a first terminating resistor provided between the first terminal and a first node;

a second terminating resistor provided between the second terminal and a second node; and a switching element provided between the first and the second nodes, wherein the switching element is turned on in a high-speed serial interface mode and is turned off in a parallel interface mode by using the power supply voltage from the receiver circuit power supply terminal.

14. An electronic apparatus, comprising:

an electro-optical device having an integrated circuit device, the integrated circuit device including:

a high-speed serial interface circuit including a receiver circuit that receives a differential signal through a serial bus;

a first terminal into which a first signal included in the differential signal is inputted;

a second terminal into which a second signal included in the differential signal is inputted;

a receiver circuit power supply terminal to which a power supply voltage applied to a high-voltage side of the receiver circuit is supplied;

a first terminating resistor provided between the first terminal and a first node;

a second terminating resistor provided between the second terminal and a second node; and a switching element provided between the first and the second nodes, wherein the switching element is turned on in a high-speed serial interface mode and is turned off in a parallel interface mode by using the power supply voltage from the receiver circuit power supply terminal.

* * * * *